United States Patent
Hausmann et al.

(10) Patent No.: US 6,721,214 B2
(45) Date of Patent: Apr. 13, 2004

(54) DRIVE CIRCUIT AND CONTROL METHOD

(75) Inventors: Michael Hausmann, Unterhaching (DE); Joachim Schnabel, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/410,933

(22) Filed: Apr. 10, 2003

(65) Prior Publication Data

US 2003/0198108 A1 Oct. 23, 2003

(30) Foreign Application Priority Data

Apr. 10, 2002 (DE) .......................................... 102 15 583

(51) Int. Cl.$^7$ ................................................. G11C 7/00
(52) U.S. Cl. .................. 365/194; 365/233; 365/189.08; 365/149; 327/153; 327/161
(58) Field of Search ................................. 365/194, 233, 365/189.08, 149; 327/153, 161

(56) References Cited

U.S. PATENT DOCUMENTS

| | | | |
|---|---|---|---|
| 6,088,255 A | * | 7/2000 | Matsuzaki et al. ............. 365/76 |
| 6,101,137 A | * | 8/2000 | Roh ............................ 365/194 |
| 6,476,657 B2 | | 11/2002 | Kuhne |

FOREIGN PATENT DOCUMENTS

DE        100 00 758 C2     8/2001

* cited by examiner

*Primary Examiner*—Connie C. Yoha
(74) *Attorney, Agent, or Firm*—Laurence A. Greenberg; Werner H. Stemer; Gregory L. Mayback

(57) ABSTRACT

A circuit has a control signal input, a control signal output, a delay element for generating a delay duration, and a control logic circuit. The latter controls the delay element and switches a change in the state at the control signal input to the control signal output in a manner delayed by the delay element, if a minimum time interval between state changes at the control signal input is undershot. The circuit is employed in DRAMs for controlling the active times of the voltage generators present in DRAMs.

9 Claims, 2 Drawing Sheets

DRIVE CIRCUIT AND CONTROL METHOD

BACKGROUND OF THE INVENTION

FIELD OF THE INVENTION

The invention relates to a drive circuit and a control method that may serve for driving a voltage generator in a dynamic random access memory (DRAM) for example.

In DRAMs, the voltage generators present in the DRAM are generally switched off in the standby mode in order to save power. To that end, on the DRAM there is a controller that uses a control signal to control the enable inputs of the voltage generators. The voltage generators have to be switched on again in the event of a change from the standby mode to the active mode. To that end, a specific minimum switch-on time duration is necessary until the voltage generators are ready for use again. In this case, the minimum switch-on time duration depends on the voltage generator itself. In the case of a voltage generator that requires a relatively long time duration in order to attain the active mode, frequent rapid changes between the standby and active modes can lead to oscillation of the voltage generator. This results in an uncontrolled behavior of the voltage generator because the switch-on operations cannot be completely ended.

Hitherto, when there has been the risk of oscillation, the problem has been solved by the active time of the voltage generators being lengthened without exception. In this case, no distinction has been made between required and unrequired lengthening of the switch-on duration.

German Patent DE 100 00 758 C2 discloses a pulse generator for DRAMs in which an input signal is put onto a signal output in a manner delayed by a defined minimum pulse duration, in order to ensure that an output pulse always has a defined minimum pulse duration.

SUMMARY OF THE INVENTION

It is accordingly an object of the invention to provide a drive circuit and a control method that overcome the above-mentioned disadvantages of the prior art devices and methods of this general type, in which oscillation of, for example, a voltage generator driven by the circuit is avoided and clearly defined states can thus be achieved for the voltage generator, the voltage generator is switched on completely and an unnecessary current consumption is avoided.

With the foregoing and other objects in view there is provided, in accordance with the invention, a drive circuit for controlling an operating mode change of a voltage generator in a memory component. The drive circuit contains a control signal input for receiving an activation signal or a deactivation signal for the voltage generator, a control signal output outputting a control output signal to the voltage generator, a delay element having an input and an output and generating a delay duration, and a control logic circuit connected to the control signal input, the control signal output and the delay element. The control logic circuit:

in an event of a signal change from the activation signal to the deactivation signal at the control signal input, switches through the deactivation signal to the control signal output directly if the delay duration prescribed by the delay element has been exceeded; and in an event of a signal change from the activation signal to the deactivation signal at the control signal input, switches through the deactivation signal to the control signal output in a manner delayed by the delay duration prescribed by the delay element, if the delay duration has been undershot.

The solution according to the invention has the advantage that the average current consumption of the driven circuits (e.g. voltage generators) is reduced through the optimized switch-on time duration.

For this purpose, the drive circuit according to the invention has a control signal input and a control signal output, a delay element for generating a delay duration, and also a control logic circuit. The latter controls the delay element and switches a change in the state at the control signal input to the control signal output in a manner delayed by the delay element, if a minimum time interval between state changes at the control signal input is undershot.

In the case of the control method according to the invention, a delay element is driven by a control logic circuit having a control signal input and a control signal output, the delay element generating a delay duration. A change in the state at the control signal input is switched by the control logic circuit to the control signal output in a manner delayed by the delay element, if a minimum time interval between state changes at the control signal input is undershot.

In one embodiment of the circuit according to the invention, the control logic circuit switches a change in the state at the control signal input to the control signal output directly, if the minimum time interval between two state changes at the control signal input is exceeded.

It is advantageous if the delay duration is adjustable because this enables the circuit to be adapted to the specific requirements of the downstream device, for example of a voltage generator.

In one embodiment of the invention, the control logic circuit has a resettable store, whose set input is connected to the control signal input and whose reset input is connected to the output of the delay element and the control signal input. The output of the control logic circuit is connected to the input of the delay element and the control signal output.

In a further embodiment of the invention, the output of the delay element is combined with the control signal input by an AND gate.

It is advantageous to configure the resettable store as an RS flip-flop since the latter constitutes a simple and cost-effective embodiment.

The circuit according to the invention advantageously serves for controlling a voltage generator.

The circuit according to the invention can also be used in a memory component, in particular a DRAM.

The circuit according to the invention is suitable for being used in an integrated component.

Other features which are considered as characteristic for the invention are set forth in the appended claims.

Although the invention is illustrated and described herein as embodied in a drive circuit and a control method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
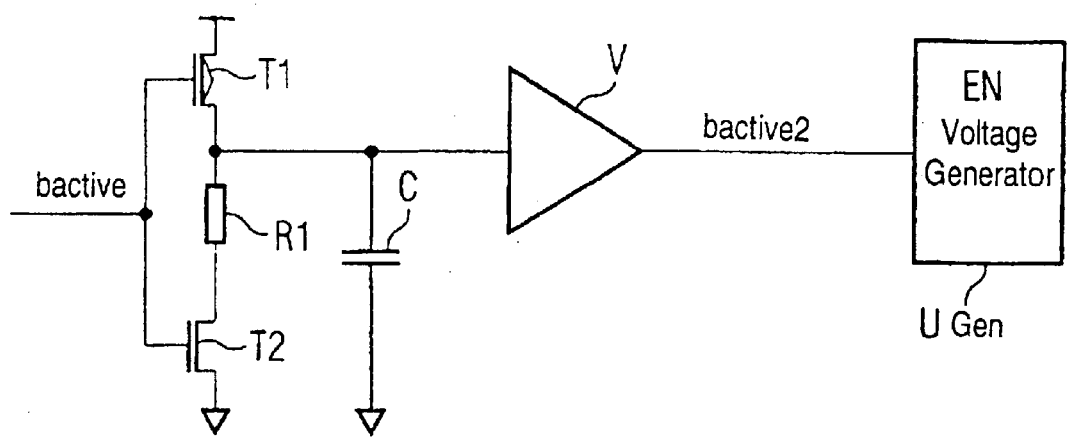
FIG. 1 is a circuit diagram of a circuit for generating a delay according to the prior art.

Referring now to the figures of the drawing in detail and first, particularly, to FIG. 1 thereof, there is shown a corresponding embodiment of the solution for controlling a voltage generator UGen according to the prior art. A drive circuit has two transistors T1 and T2 and also a resistor R1, which is disposed between the two transistors T1 and T2 and forms a series circuit together with them. A control signal bactive is passed to the control inputs of the two transistors T1 and T2 and, in the event of a state change, causes either the first transistor T1 or the second transistor T2 to be activated, that is to say to be turned on, depending on whether the state change takes place from high to low or from low to high. A capacitor C disposed in parallel with the series circuit containing the resistor R1 and the transistor T2 is thereby charged or discharged. By use of an amplifier V, whose input is connected to the transistor T1, the resistor R1 and the capacitor C, the signal, which, if appropriate, has been time-delayed by the RC element, is passed in amplified form to the output as output signal bactive2. The delay duration can be determined by way of the dimensioning of the resistor R1 and of the capacitor C. The output signal bactive2 controls an enable input EN of a voltage generator UGen described in the introduction.

Figure 2:
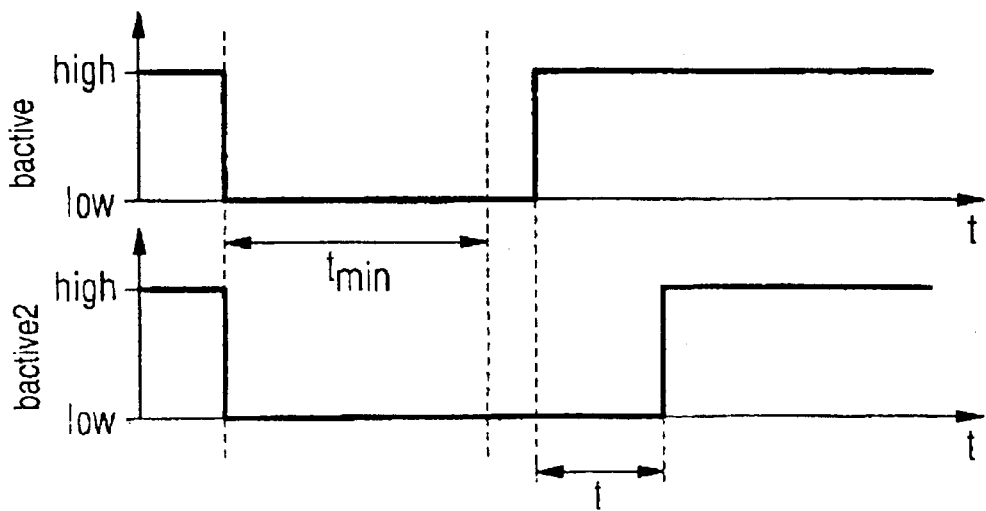
FIG. 2 is a timing diagram showing time profiles of a control signal and of an output signal with respect to the circuit illustrated in FIG. 1.

As can be gathered from the timing diagram in FIG. 2, which shows a time profile of the two signals bactive and bactive2, independently of when a state change from low to high takes place in the control signal bactive, the signal bactive2 will follow the state change in the control signal bactive in a manner delayed by a defined time duration t. As can likewise be gathered from FIG. 2, the change from high to low in the control signal bactive results in an immediate state change in the signal bactive2. The minimum switch-on duration tmin is left out of consideration in the circuit in accordance with FIG. 1. As can be discerned, since the minimum switch-on duration tmin has already elapsed, the output signal bactive2 could have directly followed the state change in the control signal bactive.

Figure 3:
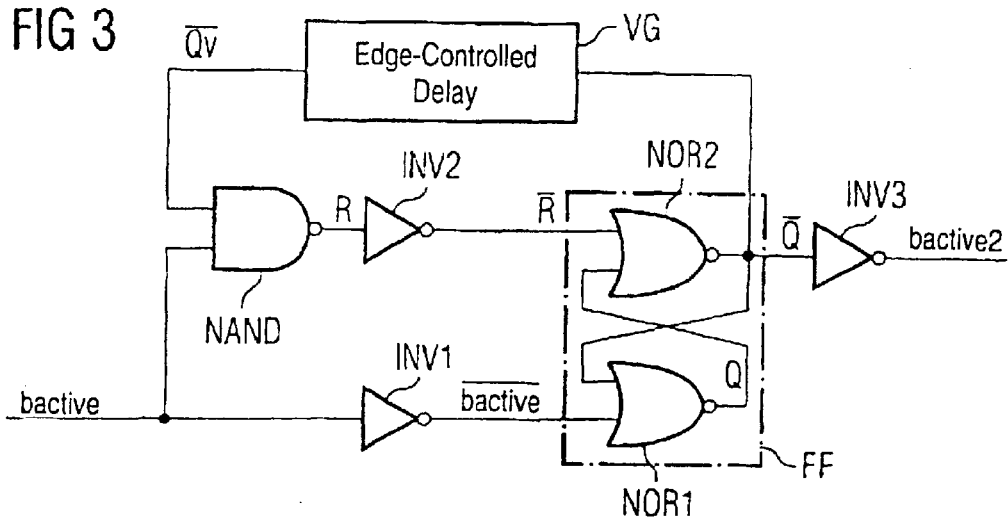
FIG. 3 is a circuit diagram of an embodiment of the drive circuit according to the invention.

The construction of the circuit as shown in FIG. 3 as one possible embodiment of the circuit according to the invention is now described below.

The circuit has a control signal input, which carries a control signal bactive. The input is connected to an input of a NAND gate NAND, and to the input of a first inverter INV1. The control signal bactive originates for example from a control logic configuration of a DRAM that controls the operating mode of further units, for example voltage generators. The control signal $\overline{\text{bactive}}$ inverted by the first inverter INV1, is present at a first input of an RS flip-flop FF. The inverted reset signal $\overline{\text{R}}$, which originates from a second inverter INV2, is present at a second input of the RS flip-flop FF. The output of the RS flip-flop FF, which carries the signal $\overline{\text{Q}}$, is connected both to the input of a third inverter INV3 and to the input of a delay element VG. The output of a delay element VG is passed to the second input of the NAND gate NAND. The two NANDed signals $\overline{\text{Qv}}$ and bactive are passed as reset signal R to an input of the inverter INV2.

The output signal bactive2 is present at the output of the third inverter INV3, by which output signal the further units, such as voltage generators, can be controlled.

In the embodiment shown in FIG. 1, the flip-flop FF is constructed with two NOR gates NOR1 and NOR2, whose outputs are respectively connected to one of the inputs of the other NOR gate.

The delay element VG is configured as an edge-controlled delay element.

The method of operation of the embodiment of the invention shown in FIG. 3 is described below.

An edge change in the control signal bactive present at the input of the circuit according to the invention, for example from the high state to the low state, causes the flip-flop FF to be set, assuming that the flip-flop FF is reset. The inverted control signal $\overline{\text{bactive}}$ in the high state at the set input of the flip-flop FF causes the output Q to change to the low state and the inverted output $\overline{\text{Q}}$ of the flip-flop FF to change to the high state and to remain in this state, independently of the temporally succeeding states of the control signal bactive. If the control signal bactive now changes from the low state to the high state again and the inverted control signal $\overline{\text{bactive}}$ thus changes from the high state to the low state again, then this does not affect the state at the inverted output $\overline{\text{Q}}$ of the flip-flop FF. It is only if the inverted reset signal $\overline{\text{R}}$ originating from the second inverter INV2 assumes the high state that the flip-flop FF is reset and the inverted output $\overline{\text{Q}}$ of the flip-flop FF assumes the low state again. The delay duration prescribed by the delay element VZ determines when the inverted reset signal $\overline{\text{R}}$ originating from the second inverter INV2 assumes the high state. As soon as the inverted output $\overline{\text{Q}}$ of the flip-flop FF changes its state from low to high, the edge-controlled delay is initiated. What is thus achieved overall is that a repeated edge change in the control signal bactive within the minimum switch-on duration tmin has no effect on the state of the output signal bactive2. It is only when the delay duration tmin has elapsed that an edge change that has already taken place in the control signal bactive can bring about a change in the state at the output of the flip-flop FF and thus in the output signal bactive2.

In the embodiment of the invention described, the falling edge of the control signal bactive is forwarded to the output of the circuit without any delay and the output signal bactive2 thus changes immediately to the low state.

However, a change in the control signal bactive from the low state to the high state takes effect only when the delay duration tmin has elapsed, the delay duration being prescribed by the delay element VG and being initiated after the falling edge of the control signal bactive.

In this connection, the delay duration is also referred to as minimum time duration tmin.

Figure 4:
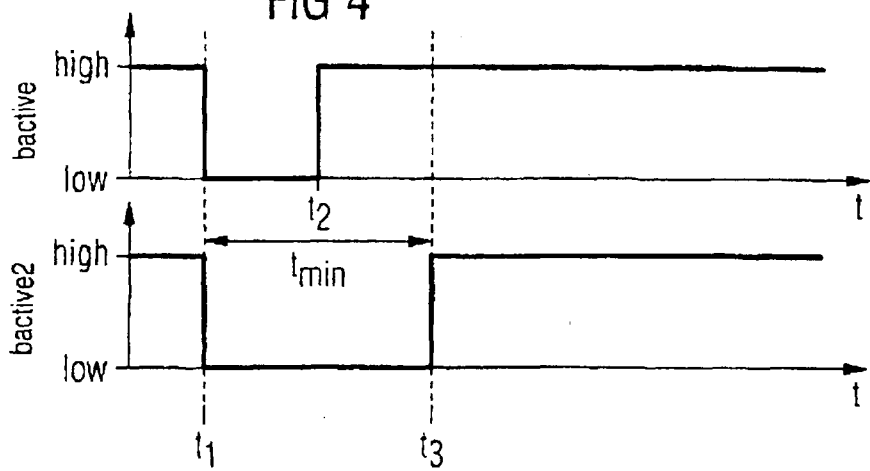
FIG. 4 is a timing diagram showing a first time profile of the control signal and of the output signal with respect to the circuit according to the invention as illustrated in FIG. 3.

The corresponding timing diagram can be gathered from FIG. 4. The control signal bactive changes its state from high to low at an instant t1. For the output signal bactive2, this immediately results likewise in a state change from high to low. If the control signal bactive changes to the high state again before the minimum time duration tmin has actually elapsed, namely at the instant t2, the output signal bactive2 follows the control signal bactive to the high state only after the minimum time duration tmin has elapsed, namely at an instant t3.

Figure 5:
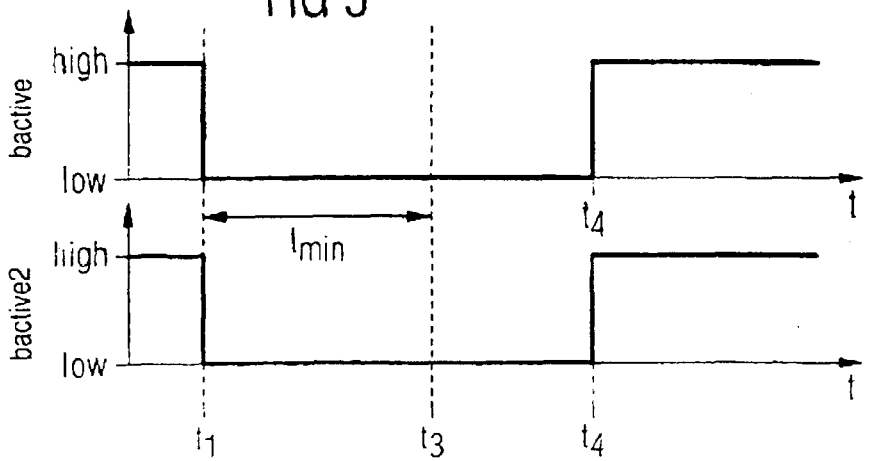
FIG. 5 is a timing diagram showing a second time profile of the control signal and of the output signal with respect to the circuit according to the invention as illustrated in FIG. 3.

The timing diagram in accordance with FIG. 5 shows a further time profile of the control signal bactive and the effects thereof on the output signal bactive2. The control signal bactive changes its state from high to low at the instant t1. For the output signal bactive2, this immediately results likewise in a state change from high to low. The two timing diagrams of FIGS. 4 and 5 correspond thus far. The control signal then changes to the high state again, at the instant t4, only after the minimum time duration tmin has elapsed. The output signal bactive2 immediately follows the control signal bactive to the high state.

The invention is not restricted to the use as an upstream circuit for the stabilization of voltage generators but rather can be used whenever stabilization, avoidance of excessively rapid frequent state changes and avoidance of the risk of oscillation are involved.

We claim:

1. A drive circuit for controlling an operating mode change of a voltage generator in a memory component, the drive circuit comprises:
    a control signal input for receiving one of an activation signal and a deactivation signal for the voltage generator;
    a control signal output outputting a control output signal to the voltage generator;
    a delay element having an input and an output and generating a delay duration; and
    a control logic circuit connected to said control signal input, said control signal output and said delay element, said control logic circuit:
        in an event of a signal change from the activation signal to the deactivation signal at said control signal input, switches through the deactivation signal to said control signal output directly if the delay duration prescribed by said delay element has been exceeded; and
        in an event of a signal change from the activation signal to the deactivation signal at said control signal input, switches through the deactivation signal to said control signal output in a manner delayed by the delay duration prescribed by said delay element, if the delay duration has been undershot.

2. The circuit according to claim 1, wherein the delay duration generated by said delay element is adjustable.

3. The circuit according to claim 1, wherein said control logic circuit has a resettable store with a set input connected to said control signal input and a reset input coupled to said output of said delay element and to said control signal input, said resettable store having an output connected to said input of said delay element and coupled to said control signal output.

4. The circuit according to claim 3, further comprising an AND gate, said input of said delay element and said control signal input are combined with one another by said AND gate.

5. The circuit according to claim 3, wherein said resettable store is an RS flip-flop.

6. A drive circuit for controlling an operating mode change of a voltage generator in a dynamic random access memory, the drive circuit comprises:
    a control signal input for receiving one of an activation signal and a deactivation signal for the voltage generator;
    a control signal output outputting a control output signal to the voltage generator;
    a delay element having an input and an output and generating a delay duration; and
    a control logic circuit connected to said control signal input, said control signal output and said delay element, said control logic circuit:
        in an event of a signal change from the activation signal to the deactivation signal at said control signal input, switches through the deactivation signal to said control signal output directly if the delay duration prescribed by said delay element has been exceeded; and
        in an event of a signal change from the activation signal to the deactivation signal at said control signal input, switches through the deactivation signal to said control signal output in a manner delayed by the delay duration prescribed by said delay element, if the delay duration has been undershot.

7. A method for controlling an operating mode change in a voltage generator in a memory component, which comprises the steps of:
    checking for a signal change from an activation signal to a deactivation signal for the voltage generator at a control signal input, and if the signal change occurs, switching through the deactivation signal using a control logic circuit directly to a control signal output for outputting a control output signal to the voltage generator, if a delay duration prescribed by a delay element has been exceeded; and
    checking for a signal change from the activation signal to the deactivation signal at the control signal input, and if the signal change occurs, switching through the deactivation signal using the control logic circuit to the control signal output in a manner delayed by the delay duration prescribed by the delay element, if the delay duration has been undershot.

8. The method according to claim 7, which further comprises adjusting the delay duration in the delay element.

9. The method according to claim 7, which further comprises using a dynamic random access memory as the memory component.

* * * * *